United States Patent [19]

Shinohe et al.

[11] Patent Number: 4,617,583
[45] Date of Patent: Oct. 14, 1986

[54] GATE TURN-OFF THYRISTOR

[75] Inventors: Takashi Shinohe, Kawasaki; Masayuki Asaka, Miura, both of Japan

[73] Assignee: Kabushiki Kaisha Toshiba, Kawasaki, Japan

[21] Appl. No.: 671,197

[22] Filed: Nov. 14, 1984

[30] Foreign Application Priority Data

Mar. 9, 1984 [JP] Japan ................................. 59-44123

[51] Int. Cl.[4] ............................................. H01L 29/74
[52] U.S. Cl. ........................................ 357/38; 357/36
[58] Field of Search .............................. 357/38, 36, 86

[56] References Cited

FOREIGN PATENT DOCUMENTS 0066850 12/1982 European Pat. Off. .
57-178369 2/1982 Japan .

OTHER PUBLICATIONS

Patent Abstracts of Japan, vol. 8, No. 4, 10th Jan. 1984, p. (E-220) (1441).
International Power Electronics Conference, p. 65, T. Yatsuo et al, Mar. 27-31, 1983.

Primary Examiner—Andrew J. James
Assistant Examiner—Sara W. Crane
Attorney, Agent, or Firm—Oblon, Fisher, Spivak, McClelland & Maier

[57] ABSTRACT

A gate turn-off thyristor has a first emitter layer having a P+ P− emitter structure which is in contact with an anode electrode and a second emitter layer having an N-type multi-emitter structure which is in contact with cathode electrodes. To reduce power dissipation in the turn-off process, the first emitter layer mainly consists of low impurity concentration regions, and each high impurity concentration region is formed to have a substantially uniform width and to surround the low impurity concentration region formed within a region of the first emitter layer immediately below one of the emitter strips of the second emitter layer.

8 Claims, 10 Drawing Figures

GATE TURN-OFF THYRISTOR

BACKGROUND OF THE INVENTION

The present invention relates to a gate turn-off thyristor (GTO).

A GTO is a switching device in which when a positive potential is applied to a gate electrode while a positive voltage is applied between the anode and the cathode, the anode-cathode path is made conductive due to the flow of gate current, and when a negative potential is applied to the gate while an anode current is flowing, part of the anode current flows into the gate so that the anode-cathode path becomes blocked. In this way, the GTO can be easily switched and can be used at a higher voltage and a larger current than power transistors. Therefore, the GTO has recently been getting attention as a high-frequency device capable of handling large power.

An example of conventional GTOs is disclosed in Japanese Laid-Open patent application No. 169973/83 laid open on Oct. 6, 1983; its problems will be described with reference to FIGS. 1 and 2.

As illustrated in FIGS. 1A and 1B, this GTO has a P+ P− emitter structure and a multi-emitter structure. Namely, as shown in a plan view of FIG. 1A, a second emitter layer in contact with cathode electrodes is divided into a plurality of substantially rectangular shaped emitter strips. As shown in FIG. 1B, a first emitter layer in contact with an anode electrode is divided into regions (P+ and P− regions) having different impurity concentrations.

More specifically, a first N-type base layer 12 is formed on a first P-type emitter layer 11. A second P-type base layer 13 is formed on base layer 12. Further, a plurality of emitter strips $14_1$ to $14_n$ is radially formed on the base layer 13. An anode electrode 15 is formed on the lower surface of the first emitter layer 11. A gate electrode 17 is formed on the upper surface of a second base layer 13, excluding portions thereof where PN-junctions are formed with emitter strips $14_1$ to $14_n$. Cathode electrodes $16_1$ to $16_n$ are formed on the top surface of the emitter strips $14_1$ to $14_n$. In order to increase a peak turn-off current $I_{TGQM}$ while suppressing the local current concentration at the time of the turn-off operation and to allow it to be performed while suppressing the carrier injection from the first P-type emitter layer 11, the emitter layer 11 is formed of regions (P+ regions) 18 each having a relatively high impurity concentration and regions (P− regions) 19 each having a relatively low impurity concentration. The region 19 is almost rectangular, similar to emitter strip 14, and is formed immediately below the corresponding emitter strip 14 within a region where the emitter strip is projected.

FIG. 2 is a waveform diagram of a voltage, current and power dissipation in the turn-off operation. When a gate switch is turned on at time $t_0$ when the GTO is conducting, the gate current $i_g$ increases in the negative direction. Then, the anode current $I_A$ starts decreasing at time $t_1$. At the same time, the anode-cathode voltage $V_A$ starts increasing. The PN-junction between gate and cathode is recovered at time $t_2$ and a gate-cathode voltage $v_g$ becomes a maximum negative value. The gate current $i_g$ also becomes its maximum almost simultaneously, thereafter rapidly decreasing. After time $t_2$, the anode current $I_A$ consists only of a residual charge component. The anode current $I_A$ for this interval is generally called a tailing current.

As the GTO turns off, current is concentrated in a region below the central portion of cathode electrode 16 that is located farthest from the gate electrode due to a lateral resistance effect in P base 13. To prevent this current concentration, a large-power GTO generally has the multi-emitter structure with emitter strips $14_1$ to $14_n$ in which the lateral resistance is small. However, it is very difficult to make characteristics of GTO elements or unit GTOs (GTO region associated with a single emitter strip) uniform. Thus, the current is eventually concentrated to one GTO element at the final stage of the turn-off process. Consequently, the GTO often breaks down due to heat generation. The anode current immediately before breakdown is the peak turn-off current $I_{TGQM}$.

As shown in FIG. 1A, in a case where the low impurity concentration region 19 is formed in a region of the first emitter layer 11 just below the emitter strip $14_n$, the current concentration in the central portion of each cathode electrode is suppressed and the current is distributed to a peripheral portion near the gate electrode 17 to which a negative bias is applied. Thus, the heat generation decreases and the anode current is preferably taken from gate electrode 17, causing the $I_{TGQM}$ to be increased. In the P+ P− emitter GTO, to further increase the $I_{TGQM}$, each low impurity concentration region 19 is formed so that its width $X_{PE-}$ becomes as wide as possible Since the carrier injection from P emitter 11 is suppressed due to a wider $X_{PE-}$, the tailing current, which largely contributes to the switching loss, can be reduced, thereby enabling the permissible operating frequency to be increased.

As described above, in the case of a conventional P+ P− emitter GTO, by making the $X_{PE-}$ wide, the $I_{TGQM}$ can be increased and the tailing current can be reduced. In this case, however, a current path between the P emitter 11 and N emitter 14 is likely to spread parallel to the major surface, which decreases the advantage of the formation of the low impurity concentration region 19. Consequently, the tailing current cannot be made sufficiently low unless the $X_{PE-}$ is so widened that the latching current and ON-state voltage increase.

SUMMARY OF THE INVENTION

It is an object of the present invention to provide a gate turn-off thyristor which can reduce power dissipation during the turn-off process.

A gate turn-off thyristor according to the invention has a first emitter layer having a P+ P− emitter structure in contact with an anode electrode and a second emitter layer having an N-type multi-emitter structure in contact with cathode electrodes. According to the invention, the first emitter layer mainly consists of a low impurity concentration region (P− regions). The high impurity concentration regions (P+ regions) of the first emitter layer, which have a uniform width, are each formed so as to surround at least a part of the periphery of the corresponding low impurity concentration region formed in a region of the first emitter layer immediately below the emitter strip of the second emitter layer.

According to the structure of the invention, the high impurity concentration region of the first emitter is formed only near the boundary of the region corresponding to the emitter strip. Thus, the extent of the spread of the current path between the first emitter and the second emitter is restricted, thereby enabling the tailing current to become sufficiently small without making the width of the low impurity concentration region immediately below the multi-emitter strip so wide.

Assuming that the width of the low impurity concentration region surrounded by the high impurity concentration region is $X_{PE-}$ and that the width of the high impurity concentration region is $X_{PE+}$, a parameter $(X_{PE-}/2)/X_{PE+}$, which is a criterion of the initial value $I_{t1}$ of the tailing current and of the injection efficiency from the first emitter, is set as follows:

$$(X_{PE-}/2)/X_{PE+} \geq 0.3$$

This parameter represents a ratio of occupancy of the low impurity concentration region to the high impurity concentration region of the P-type emitter layer in the unit GTO. The value of $I_{t1}$ decreases with an increase in $(X_{PE-}/2)X_{PE+}$ and becomes constant when the parameter becomes 0.3 or more as shown in FIG. 4.

DETAILED DESCRIPTION OF THE PREFERRED EMBODIMENTS

Figure 1A:
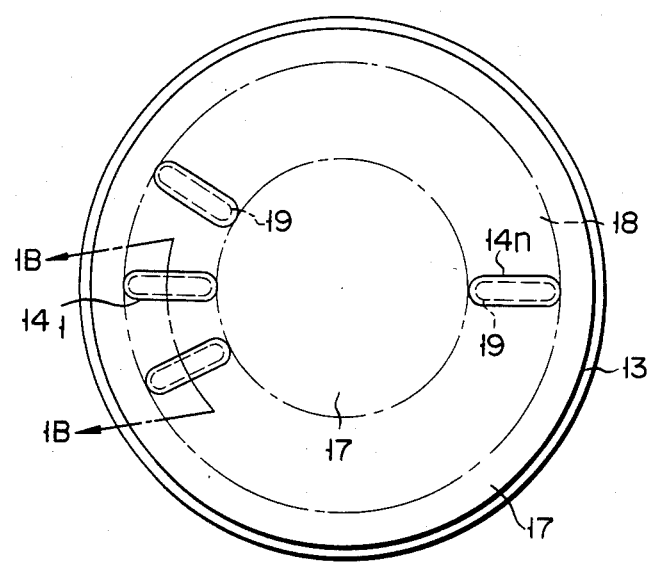
FIG. 1A is a schematic top view of a conventional gate turn-off thyristor.
Figure 1B:
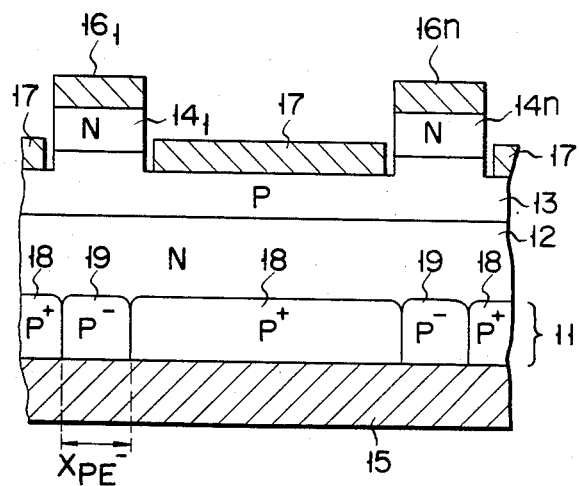
FIG. 1B is a cross-sectional view taken along the line 1B—1B of the gate turn-off thyristor of FIG. 1A.
Figure 2:
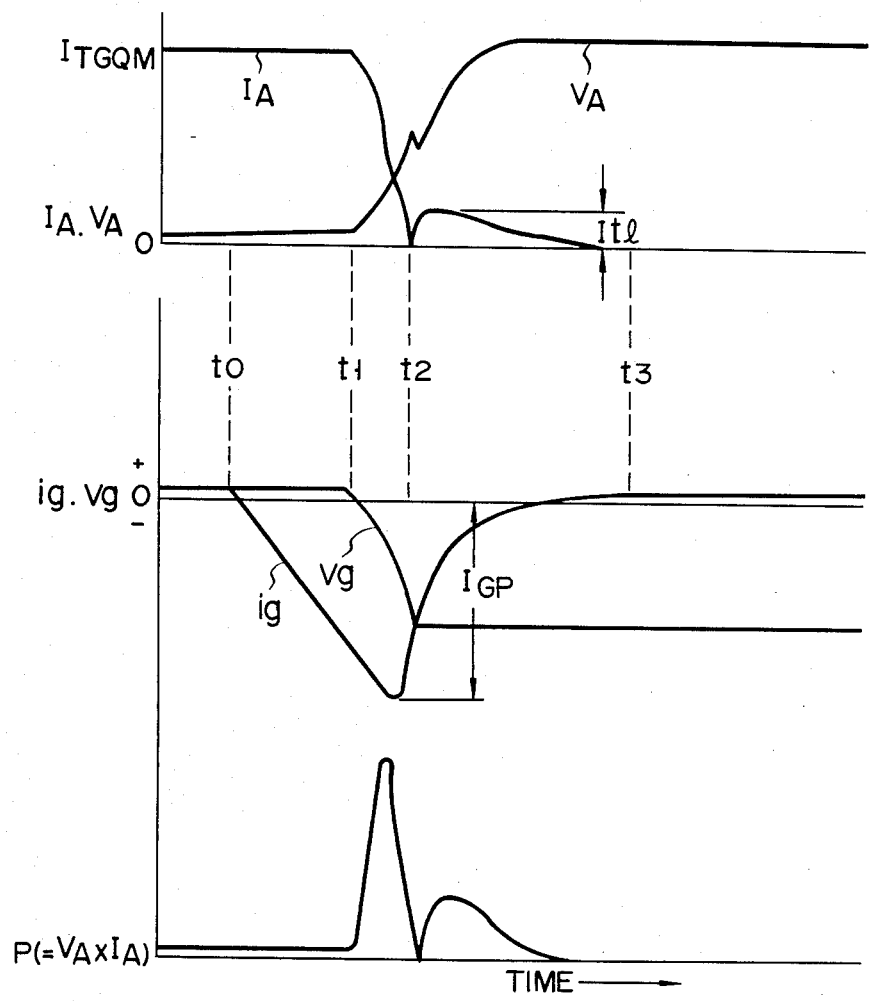
FIG. 2 is a waveform diagram explaining voltage, current and power dissipation when the gate turn-off thyristor is turned off.
Figure 3A:
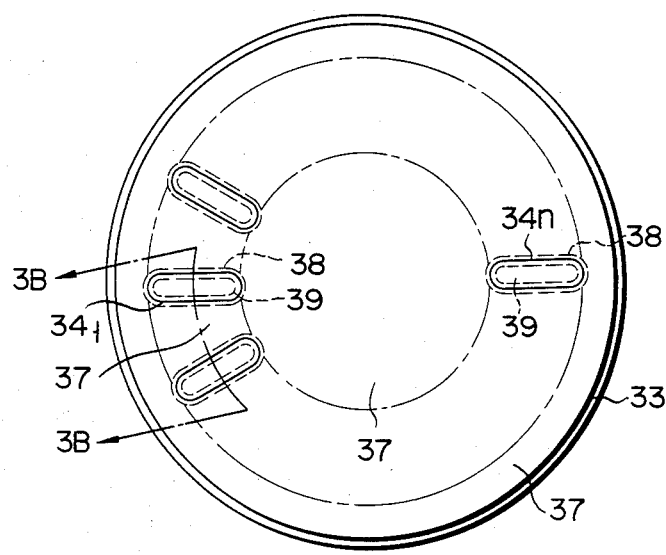
FIGS. 3A and 3B are a top view and a partial cross-sectional view of a gate turn-off thyristor according to the present invention, respectively.

An embodiment of a GTO of the present invention will now be described with reference to FIGS. 3A and 3B. The GTO of the invention has the same structure as that of the conventional GTO shown in FIGS. 1A and 1B except for the first P+ P− type emitter layer. Low impurity concentration regions 39 of a P-type emitter 31 have an impurity surface concentration of $4.5 \times 10^{16}$ cm$^{-3}$ and a thickness of 30 μm, while high impurity concentration regions 38 have an impurity surface concentration of $4.0 \times 10^{19}$ cm$^{-3}$ and a thickness of 25 μm. An N-type base 32 has an impurity concentration of $3.0 \times 10^{13}$ cm$^{-3}$ and a thickness of 600 μm. A P-type base 33 has an impurity surface concentration of $8.5 \times 10^{17}$ cm$^{-3}$ and a thickness of 40 μm. N-type emitters (emitter strips) $34_1$ to $34_n$ have an impurity surface concentration of $2.0 \times 10^{20}$ cm$^{-3}$ and a thickness of 10 μm. The width $X_k$ of each N-type emitter strip 34 is 350 μm, and the width $X_{PE-}$ of low impurity concentration region 39 of P-type emitter 31, which has a nearly rectangular like shape and is formed just below N-type emitter strip 34, is 100 μm. The width $X_{PE+}$ of high impurity concentration region 38 which surrounds low impurity concentration region 39 is 160 μm. Therefore, the value of the above-mentioned parameter is 0.31. A silicon substrate having a diameter of 18 mm was used as a substrate.

In the GTO having such a structure, since each high impurity concentration region 38 of P-type emitter 31 is arranged only just below the periphery of a PN-junction formed between N-type emitter strip 34 and P-type base 33, the spread of the current path between P-type emitter 31 and N-type emitter 34 is restricted. Thus, the effectiveness of low impurity concentration region 39 is enhanced. Consequently, a sufficiently small value of $I_{t1}$ can be realized without making the $X_{PE-}$ very wide.

In the GTO of the invention, since the Itl can be reduced by not only a larger $X_{PE-}$ but also by a smaller $X_{PE+}$, there is no need to increase the $X_{PE-}$ to a value which is large enough to impair the latching current and ON-state voltage characteristics. In other words, the power dissipation during the gate turn-off process can be reduced while maintaining small latching current and ON-state voltage.

When comparing the characteristics of the GTO of the invention and the conventional GTO having the same $X_{PE-}$, both ON-state voltages are 3.3 V and both $I_{TGQM}$ are 800 A; on the other hand, the $I_{tl}$ is reduced to 10 A as compared with 25 A in the conventional GTO. Thus, the turn-off power dissipation is reduced to 75%.

Figure 5A:
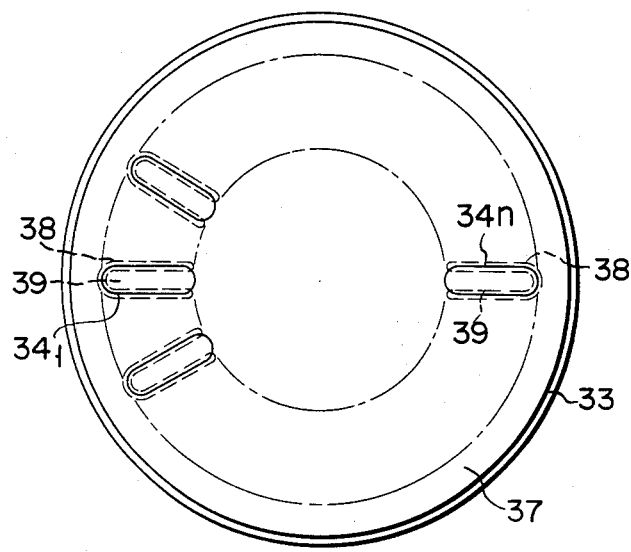
FIGS. 5A to 5D show modified forms of the invention.
Figure 5B:
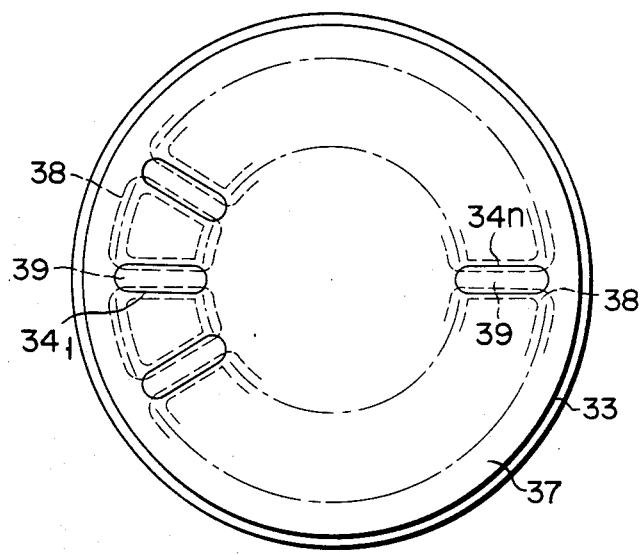
Figure 5C:
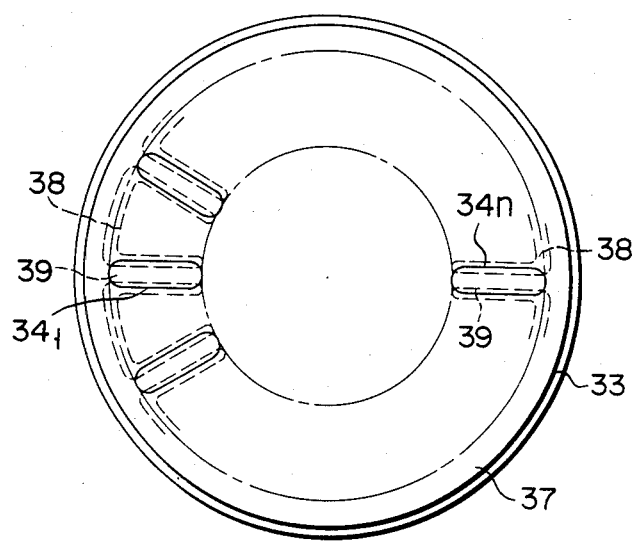
Figure 5D:
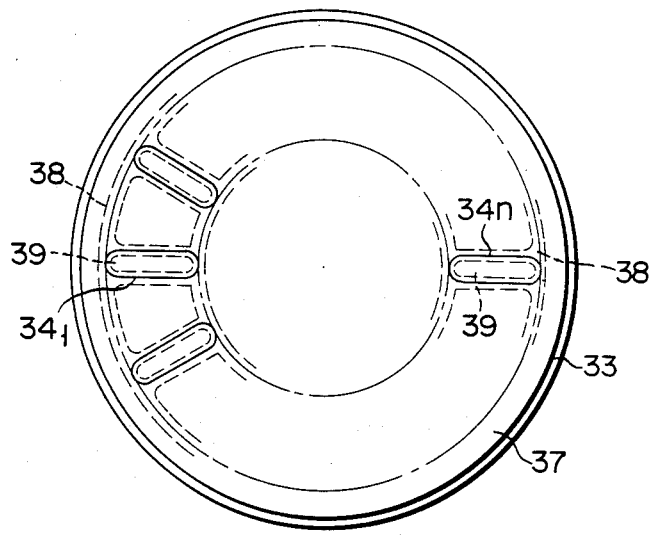

In the embodiment shown in FIGS. 3A and 3B, each high impurity concentration region 38 surrounding corresponding low impurity concentration region 39 of P emitter 31 is annularly formed immediately below the boundary of N emitter 34. However, the shape of high impurity concentration region 38 may be modified as illustrated in FIGS. 5A to 5D. In an example of FIG. 5A, part of high impurity concentration region 38 is cut away on the side of the center of GTO. The turn-off characteristic is improved by cutting the high impurity concentration region 38 on the side opposite to bonding positions of the gate electrodes. In the example of FIG. 5B, the high impurity concentration region 38 is formed to have a nearly trapezoid annular shape along the opposite long sides of the P− emitter regions corresponding to the two adjacent emitter strips. Namely, the high impurity concentration regions 38 associated with adjacent GTO elements are linked. In the example of FIG. 5C, the side region, on the central portion side of the GTO, of the high impurity concentration region 38 of FIG. 5B is removed. The example of FIG. 5D combines the shapes of the high impurity concentration regions 38 shown in FIGS. 3A and 5B. That is, the high impurity concentration region 38 is integrally formed so as to surround all low impurity concentration regions 39.

Figure 3B:
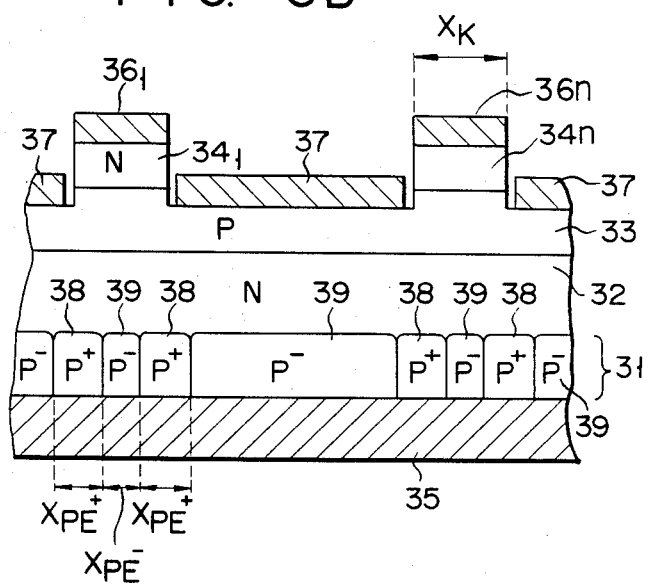
Figure 4:
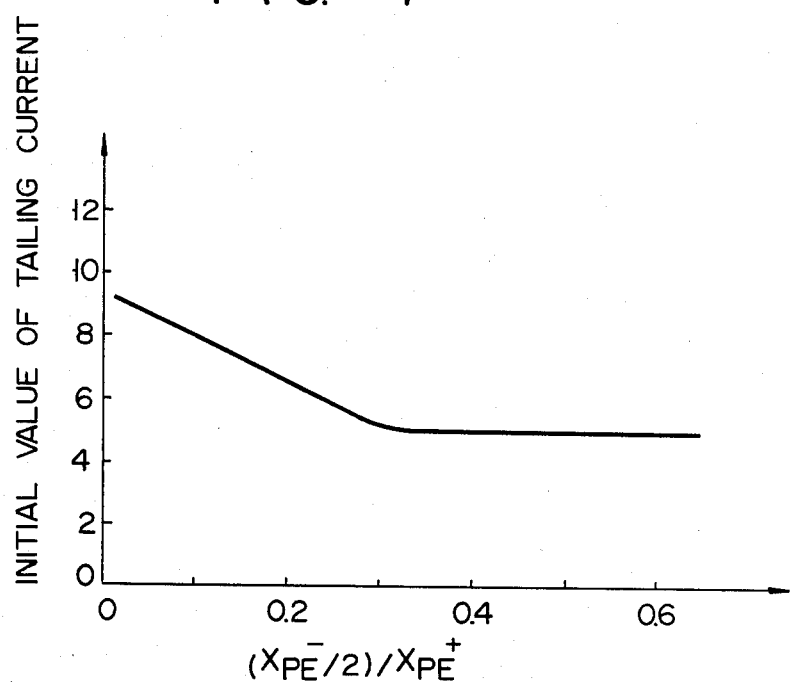
FIG. 4 is a graph showing an initial value of tailing current as a function of parameter $(X_{PE-}/2)/X_{PE+}$.

In the structure shown in FIG. 3B, a thin layer of a high impurity concentration region may be formed on the surface of P emitter layer 31 to improve the ohmic contact with anode electrode 35.

Although the GTO of the invention has been described in regard to the GTO having a reverse blocking capability, the effect of the GTO of the invention will not be lost even if the structure of the invention is applied to a GTO of reverse conducting type.

What is claimed is:

1. A gate turn-off thyristor comprising:
   a first emitter layer of a first conductivity type which mainly consists of a low impurity concentration region;
   a first base layer of a second conductivity type formed on said first emitter layer;
   a second base layer of said first conductivity type formed on said first base layer;
   a second emitter layer of said second donductivity type formed on said second base layer and divided into a plurality of emitter strips having a nearly rectangular shape, said nearly rectangularly shaped emitter strips being arranged in a circle such that the lengthwise direction of each rectangularly shaped emitter strip coincides with the radial direction of the circle;

an anode electrode formed on said first emitter layer;

cathode electrodes formed on said emitter strips of said second emitter layer;

a gate electrode formed on said second base layer except on portions of said second base layer that form said PN junctions with said emitter strips; and a plurality of high impurity concentration regions of said first conductivity type and of a substantially uniform width formed in said first emitter layer, said high impurity concentration regions being formed such that boundary lines of a projection of said rectangularly shaped emitter strips on said first emitter layer, which boundary lines extend in the lengthwise directions of said emitter strips, are located within at least one of said high impurity concentration regions of said first emitter layer and substantially surround a low impurity concentration region in said first emitter layer that is located just below one of said emitter strips.

2. A thyristor according to claim 1, wherein:

said low impurity concentration region of said first emitter layer that is surrounded with said high impurity concentration region of said first emitter layer has a substantially uniform width equal to $X_{PE-}$ and said high impurity concentration region of said first emitter layer has a width equal to $X_{PE+}$, and wherein $X_{PE-}$ and $X_{PE+}$ are related such that $(X_{PE-}/2)/X_{PE+} \geq 0.3$ 3. A thyristor according to claim 1, wherein:

each of said high impurity concentration regions in said first emitter layer is formed to completely surround a respective of said low impurity concentration region that is located just below one of said rectangularly shaped strips.

4. A thyristor according to claim 1, wherein:

each of said high impurity concentration regions is formed to surround a respective of said low impurity concentration regions located just below one of said rectangularly shaped emitter strips except for a portion of said rectangularly shaped emitter strips located adjacent and opposite to bonding portions of said gate electrode.

5. A thyristor according to claim 1, wherein:

said low impurity concentration region located just below one of said rectangularly shaped emitter strips is substantially surrounded by adjacent ones of said high impurity concentration regions.

6. A thyristor according to claim 5, wherein:

each of said high impurity concentration regions is formed to substantially surround a low impurity concentration region of said first emitter layer that is lcoated between low impurity concentration regions surround by said high impurity concentration regions.

7. A thyristor according to claim 6, wherein:

said low impurity concentration region that is located just below one of said rectangularly shaped emitter strips is completely surrounded by one of said high impurity concentration regions.

8. A thyristor according to claim 1, wherein:

said first conductivity type is a P type and said second conductivity type is N type.

* * * * *